United States Patent [19]
Ghahremani

[11] Patent Number: 6,072,346
[45] Date of Patent: Jun. 6, 2000

[54] METASTABLE PROTECTED LATCH

[75] Inventor: Shahram Ghahremani, Escondido, Calif.

[73] Assignee: Metaflow Technologies, Inc., La Jolla, Calif.

[21] Appl. No.: 08/999,212

[22] Filed: Dec. 29, 1997

[51] Int. Cl.[7] ................................................ H03K 3/02
[52] U.S. Cl. .................... 327/198; 327/142; 327/199; 326/94
[58] Field of Search .................... 327/141, 142, 327/198, 199, 210–212, 200–203, 213–215; 326/94–98, 12

[56] References Cited

U.S. PATENT DOCUMENTS 5,754,070   5/1998   Baumann et al. ...................... 327/198

OTHER PUBLICATIONS

Metastability in CMOS Library Elements in Reduced Supply and Technology Scaled Applications; by C.Portmann and T. Meng; IEEE Journal of Solid–State Circuits vol. 30, No. 1, Jan. 1995; pp. 39–46.
Metastability of CMOS Latch/Flip–Flop; by L.Kim and R.Dutton, IEEE Journal of Solid–State Circuits vol. 25, No. 4, Aug. 1990; pp. 942–950.
How to Detect Metastability Problems; by Hoang Nguyen, ASIC & EDA, Feb. 1993; pp. 16–24.
Exorcise Metastability from Your Design; by David Shear, EDN Dec. 10, 1992; pp. 58–64.
Control Metastability in High Speed CMOS Circuits; by T.Bowns; Design Applications, Sep. 26, 1991; pp. 74, 76, 78, and 80.
Metastability Behavior of CMOS ASIC Flip–Flops in Theory and Tests; IEEE Journal of Solid–State Circuits; vol. 24, No. 1, Feb. 1989.
Metastable Behavior in Digital Systems; IEEE DesIgn & Test of Computers; by L.Kleeman and A.Cantoni, 1987; pp. 5–18.
Design; by S.Baker; Electronic Engineering Times; Mar. 9, 1992; pp. 37 and 38.
An Intuitive Look at Metastability; by B.Moyer; Electronic Engineering Times; Mar. 1, 1992; pp. 37–38.
Metastable–Resistant PLDs; By S.Dingman; Electronic Engineering Times; Mar. 9, 1992; pp. 38 and 39.

*Primary Examiner*—Timothy P. Callahan
*Assistant Examiner*—Minh Nguyen
*Attorney, Agent, or Firm*—Theodore E. Galanthay; Lisa K. Jorgenson; Jeffrey D. Moy

[57] ABSTRACT

The present invention provides a level sensitive circuit connected to the output portion of a register, which synchronizes an asynchronous input to a clocked network driven by the CPU system clock. The level sensitive circuit ensures that the output of the synchronizing register will always be a definite binary signal, i.e. logical 0 (ground, or absence of voltage) or logical 1 (voltage). The present invention not only minimizes the occurrence of a metastable condition, but also recognizes that metastability may occur. The present invention is optimized to prevent metastability and includes a synchronizing latch having an output circuit with a feedback mechanism that effectively causes the output voltage of the register to be a valid signal only when any metastable condition has resolved itself. More particularly, the non-inverted output of the register is utilized as feedback to the level sensitive circuit. Based on the various threshold voltages of the transistors in the level sensitive circuit, the output of the register will switch only when a sufficiently stable voltage (high or low) is present as the output of the level sensitive circuit.

11 Claims, 3 Drawing Sheets

METASTABLE PROTECTED LATCH

CROSS REFERENCE TO RELATED APPLICATIONS

U.S. patent application "METASTABLE-PROOF FLIP FLOP", having a filing date of Nov. 14, 1989, Ser. No. 07/436,425, attorney docket no. 97-LJ-128 and assigned to the assignee of the present invention.

BACKGROUND OF THE INVENTION

1. Field of the Invention

The present invention relates to eliminating the metastability in a circuit which is used to synchronize an asynchronous digital data signal, or the like, with a network driven by a system clock (synchronous). In particular, a level sensitive portion is added to the synchronizing circuit which ensures a definite binary voltage level is output to the synchronous network.

2. Description of Related Art

Typically, a latch, or register, is used to synchronize a data signal from a first clock domain into a second clock domain, where the first clock domain is asynchronous to the second. The register receives the asynchronous data signal from the first clock domain, but does not output the signal to the second clock domain, until its system clock transitions.

Generally, metastability is an event which causes a bi-stable element to require an indeterminate amount of time to generate a valid output. Metastability may occur when the data signal, input to the register, and the system clock (also input to the register) transition at nearly the same point in time. When this occurs, the circuitry does not have enough energy to drive the output signal to either a definite "high" (logical 1) or "low (logical 0). Logical 1 is the presence of a voltage, which may be 5, volts, 3.3 volts, 2.5 volts, or the like, depending on the type of circuit technology. Logical 0 is defined as the absence of a voltage, or ground potential, i.e. 0 volts. Since, during metastability, the energy level is insufficient to cause a definitive value to be output by the register, the output voltage can hover, or oscillate, between logical 0 and logical 1 for an extended period of time before resolving itself to high or low. Theoretically, the metastable state could be maintained indefinitely, however in reality external forces, such as electrical noise will cause the output to settle at either the high level or low level within a definable time period.

The instability of the output signal can cause other portions of the system to become unstable and give incorrect results, cause the system to crash, or even damage other components in the system.

Types of signals that may require synchronization with the system clock can include asynchronous communication signals inputs form a modem, keyboard or other user interface, analog to digital (A/D) converters, multiport memories, or the like. As microprocessor manufacturers build systems with increasingly faster clock speeds, the possibility that an asynchronous data signal and the system clock signal (both input to a synchronizing register) will transition at, or near the same time, becomes more likely to occur, with metastability being the result.

Conventional systems have been developed which use multiple synchronizer stages and multiple cycle synchronizers. With multiple synchronizer stages, additional registers are added to receive the asynchronous signal. This decreases the probability that a metastable condition will ever occur, since the output of the first register will have to be in a metastable condition when it is input to a second register, and so forth. This conventional solution is based on the probability of a metastable condition continuing for two or more clock periods is relatively small. Multiple cycle synchronizers slows down the clock rate to allow the registers more time to resolve a metastable output. The asynchronous input is sampled at a slower clock rate by dividing the system clock by N, using a 1/N divider circuit.

The multiple synchronizer stage technique requires additional register(s), which increase the system overhead by adding complexity that impacts performance. The conventional multiple cycle synchronizer intentionally slows the clock speed which also degrades performance. Further, each of these conventional approaches address the issue of trying to prevent metastability, rather than providing a definitive output value, independent of the occurrence of a metastable condition. Therefore, it can be seen that need exists for a solution to the metastability problem that ensures a definite voltage level output, regardless of whether the asynchronous data input signal and system clock signal transition at, or near the same time.

SUMMARY OF THE INVENTION

In contrast to the prior art, the present invention includes a level sensitive circuit connected to the output portion of the synchronizing register. The level sensitive circuit ensures that the output of the synchronizing register will always be a definite binary signal, i.e. logical 0 (ground, or absence of voltage) or logical 1 (voltage).

Broadly, the present invention is a register that received an asynchronous signal from a first time domain and synchronizes this asynchronous signal with the system clock of a second time domain. In this manner the asynchronous signal is input to the synchronous network and provides valid data thereto.

The synchronizing register of the present invention includes an output circuit with a feedback mechanism that effectively causes the output voltage of the register to be a valid signal only when any metastable condition has resolved itself. More particularly, the non-inverted output of the register is utilized as feedback to the level sensitive circuit. Based on the various threshold voltages of the transistors in the level sensitive circuit, the output of the register will switch only when a sufficiently stable voltage (high or low) is present as the output of the level sensitive circuit. Thus, the present invention is capable of adjusting the switching threshold voltage of the synchronizing latch to account for the possibility that a metastable state will occur.

Therefore in accordance with the previous summary, objects, features, and advantages of the present invention will become apparent to one skilled in the art from the subsequent description and the appended claims taken in conjunction with the accompanying drawings.

DETAILED DESCRIPTION OF THE PREFERRED EMBODIMENTS

Figure 1:
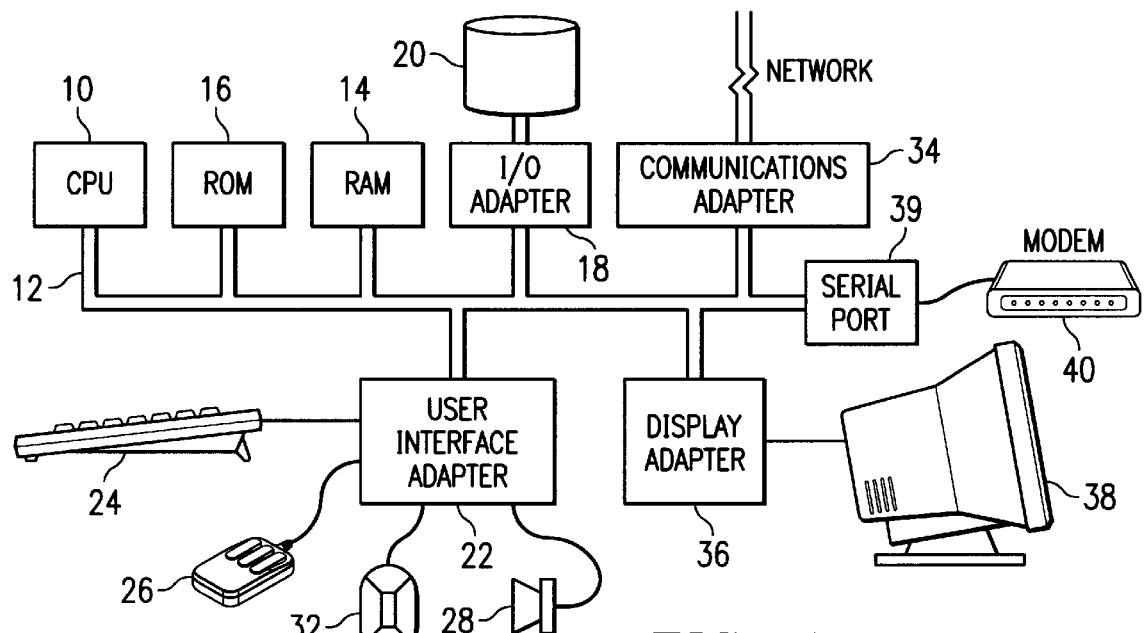
FIG. 1 is a block diagram of a data processing system which includes components likely to need metastability protection as provided by the present invention.

Referring to FIG. 1, a typical data processing system is shown which may be used in conjunction with the present invention. A central processing unit (CPU) 10, such as an Intel Pentium microprocessor, commercially available from Intel Corporation is provided and interconnected to the various other system components by a system bus 12. Read only memory (ROM) 16 is connected to CPU 10 via bus 12 and includes the basic input/output system (BIOS) that control the basic computer functions. Random access memory (RAM) 14, I/O adapter 18 and communication adapter 34 are also connected to system bus 12. I/O adapter 18 may be a small compute system interface (SCSI) adapter that communicates with a disk storage device 20. Communications adapter 34 interconnects bus 12 with an outside network enabling the data processing system communicate with other such systems. A port 39 is shown which connects a modem 40 to microprocessor 10 via bus 12. Modem 40 may be connected to various of the on-line computer services or the Internet. User input/output devices are also connected to system bus 12 vias user interface adapter 22 and display adapter 36. Keyboard 24, track ball 32, mouse 26 and speaker 28 are all interconnected to bus 12 via user interface adapter 22. Display monitor 38 is connected to system bus 12 by display adapter 36. In this manner, a user is capable of inputting to the system through keyboard 24, trackball 32 or mouse 26 receiving output from the system via speaker 28 and display 38. Additionally, an operating system (OS) such as DOS, OS/2, Windows 95, Windows NT, or the like is used to coordinate the functions of the various components shown in FIG. 1.

As one example, the present invention may be implemented in the circuitry of microprocessor 10. This microprocessor will include a system clock that regulates the frequency of the circuits therein. A data signal received from modem 40 would be considered an asynchronous signal to the microprocessor system. Thus, the present invention could be utilized to receive the asynchronous signal from modem 40 (via bus 12) and ensure that this signal is provided to microprocessor 10 as a synchronized data signal having a definite value. In accordance with the present invention the data signal input to microprocessor will have a definite value even if a metastable condition should occur, wherein the data signal input to the synchronizing register of the present invention and the system clock transition at, or near the same time.

Figure 2:
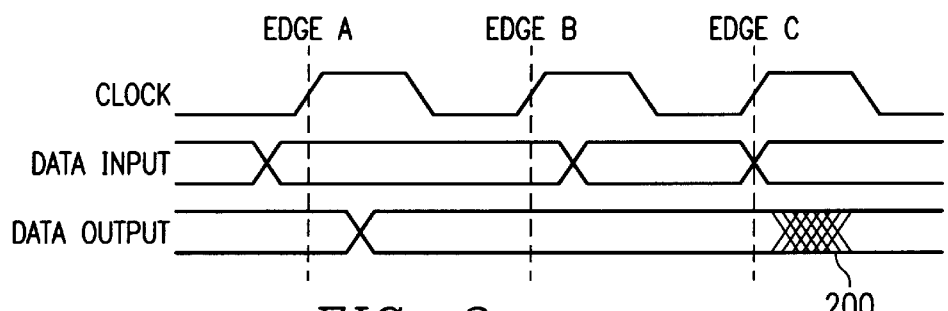
FIG. 2 is a timing diagram showing the clock and data signals input to a synchronizing register, and the data output from the register, at various points in time.

Referring to FIG. 2, a timing diagram is shown wherein a system clock signal from the synchronized network is shown, along with an asynchronous data input signal. The data output signal from the synchronizing latch of the present invention is also shown. Three clock edges A, B and C are shown. It can be seen that normal data output occurs when the input asynchronous data transitions a sufficient amount of time either before or after the clock edge transition. The data input transitions before clock edge A and after clock edge B. However, the asynchronous data changes state substantially at the same time as the clock transitions at edge B. In this case a metastable condition can occur and the output data oscillates between the high and low states, as shown by reference numeral 200. This is due to the fact that, at clock edge C, the circuitry is unable to determine whether the correct value is logical 0 or logical 1, since the data input is in a transition.

Figure 3:
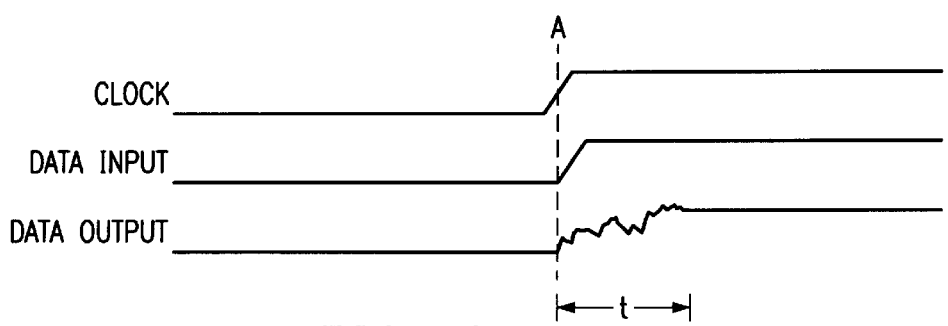
FIG. 3 is another timing diagram showing the metastability of an output signal which can occur when the clock and data input signals transition at, or nearly the same time.

Referring to FIG. 3, another timing diagram is shown to further describe how a metastability occurs in a synchronizing circuit. Again, a system clock signal from a synchronized network is shown, along with the asynchronous data input to the latch and the data output from the latch. It is possible to calculate the probability that the situation depicted in FIG. 3 will occur, by determining the MTBF for the specific system. In any event, when the asynchronous data input changes state at a time too near the clock transition point A, then metastability can occur. In FIG. 3, the data output oscillates for a time period t. For example, if the system utilized a 2.5 volt power supply, then most N type devices (NMOS transistors) will switch on at not less than approximately 1.8 volts. And, P-type devices (PMOS transistors) will switch on at not greater than approximately 0.7 volts. Therefore, a range of voltage levels from approximately 0.7 to 1.8 volts (1.1 volt range) exists that can cause erroneous data values to be output from the synchronizing latch. That is, output voltage oscillations in this range will not result in the correct switching of subsequent circuit devices and can cause erroneous data to be used, system failure, and even component damage.

The metastable condition which occurs when a low signal transitions to a high level has been shown and described. However, it should be understood that metastable conditions also occur when the data input signal is transitioning from a high level to a low level.

Figure 4:
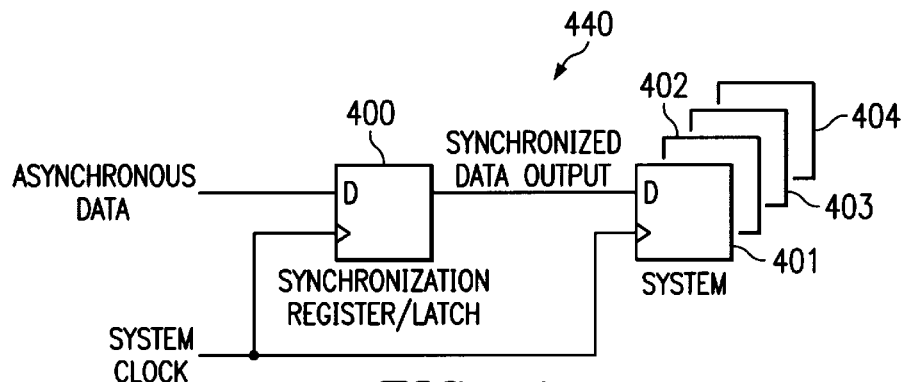
FIG. 4 is a block diagram of a synchronizing system that would include the circuit of the present invention.

FIG. 4 is a block diagram of the system components that send and receive the signals described with respect to FIGS. 2 and 3. An asynchronous data signal is shown being input to synchronization latch 400 at port "D". The system clock input is also shown and input to latch 400. A synchronized network 440 is also depicted in FIG. 4. Network 440 includes various latches 401, 402, 403, 404 which receive and transmit synchronized signals and perform various data processing functions. These functions include providing logical components found in an arithmetic logic unit (ALU), cache controller, data or instruction queue, or the like.

Synchronized data is output from latch 400 and input to system 440 as synchronized data. Thus, it can be seen that data from an asynchronous network (e.g. data received from a modem, or other type of communications network, keyboard, or other type of user I/O devices) is synchronized with the clocked network 440. This is due to the fact that the system clock will only allow the asynchronous data to be input to the synchronous network during the appropriate clock cycle.

Figure 5:
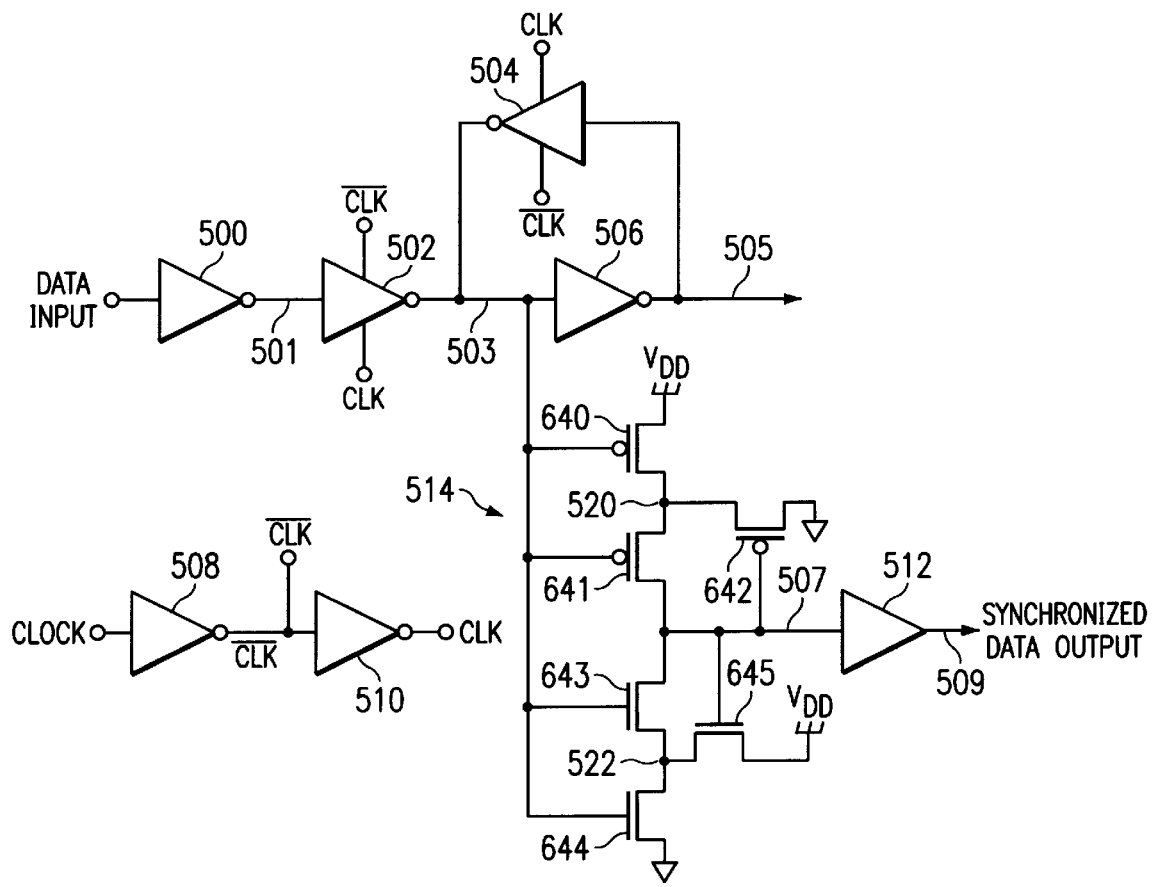
FIG. 5 is a logic diagram of a preferred embodiment of the present invention including the level sensitive output portion.

FIG. 5 shows a logic diagram of a synchronizing latch which embodies the preferred embodiment of the present invention. The data signal, such as asynchronous data signal shown in the timing diagrams of FIGS. 2 and 3, is input to an inverter 500. The clock signal (CLK) is input to another inverter 508, the output of which is the clock signal complement (CLK_, i.e. when the clock signal is at a high level (logical 1), then the complement will be a low logic level (logical 0). Similarly, when CLK is low (0), then CLK_ is high (1). Another inverter 510 is provided to change the CLK_ signal back to the same level (high or low) as the input clock signal (CLK) and distribute the CLK signal to other components in the circuit.

The data input signal will be flipped to the other value by inverter 500 and placed on node 501. A clock gated inverter 502 will invert the data on node 501 back to its original value and latch the data in on node 503. The data is latched in, when the system clock signal (input to inverter 508) is high (see clock signal of FIG. 2). At the next phase when the clock signal low the data signal (0 or 1) present on node 503 is maintained. This data maintenance occurs since the data signal on node 503 is inverted, by inverter 506, and placed on node 505 and feedback to node 503 through another gated inverter 504, which conducts the signal at each phase of clock which is at a low level (logical 0). It is possible to use the output of node 505 for some less critical system components, however, the output of node 505 does not take advantage of the metastability protection of the present invention.

It can be seen from FIG. 5 that node 503 is also connected to an inverter 514 that includes two feedback transistors, each with their gates connected to the output of inverter 514 at node 507. Inverter 514 includes two P type transistors 640 and 641. Transistor 640 has its source connected to the system power supply voltage (Vdd) and its drain connected to the source of transistor 641 at node 520. Transistor 641 has its drain connected to node 507. Inverter 514 also includes two N type transistors 643 and 644. Transistor 644 has its source connected to ground (0 volts) and its drain connected to the source of transistor 643 at node 522. The drain of transistor 643 is connected to node 507. The gates of each of P type transistors 640, 641 and N type transistors 643, 644 are connected to node 503, where the input data is latched.

A first P type feedback transistor 642 is provided with its source connected to ground and its drain connected between P type transistors 640 and 641 at node 520. An N type feedback transistor 645 is also provided and has its source connected to Vdd and its drain connected between N type transistors 643 and 644 at node 522. As mentioned above, the gate of feedback transistors 642 and 645 are connected to the output of inverter 514 on node 507.

Inverter 514, including feedback transistors 642 and 645 provides the metastability protection in the preferred embodiment of the present invention. It should be noted that the circuit of FIG. 5 including inverters 500, 502, 504, 506, 508 and 510 comprises a cascode configuration of a CMOS D-Latch and does afford some protection from a metastable condition by providing better resolving capability to exit the metastable state. However, by implementing the present invention, this protection of metastable output data is ensured, since inverter 514 will only output data having a definite high (1) or low level (0).

When a metastable condition exists for the data on node 503, the logical value will oscillate somewhere between 0 and 1, or for example between 0 and 2.5 volts. At this voltage level, switch for P type devices may not occur until the voltage drops below 0.7 volts and N type devices may not switch until the voltage level reaches at least 1.8 volts. Thus, during metastability, various intermediate voltages will be present on node 503, such that none of transistors 640, 641, 643, 644 will switch with enough energy to drive the output on node 507 to a definite Vdd or ground. Feedback transistors 642 and 645 are added that will effectively adjust the switching threshold of transistors 640, 641 and 643, 644, respectively. In this manner, inverter 514 will switch only when there is a definite, predetermined value, and ensure that the output data is at a definite high or low level.

The present invention will now be described in greater detail in conjunction with FIG. 6, which is a schematic diagram of the circuit devices used to implement the metastable protected latch of the present invention. The clock signal, from the system clock of the network receiving the asynchronous data signal, is input to inverter 508. This inverter includes P type transistor 612, connected to Vdd, and N type transistor 613, connected to ground. The output of inverter. 508 is input to the gates of P type transistor 618 (connected to Vdd) and N type transistor 619 (connected to ground). Thus, the actual clock signal (CLK) is input to inverter 508 and its complement (CLK_) is then output therefrom and input to inverter 510. The clock signal (CLK) is then output from inverter 510. As discussed in more detail below, the CLK and CLK_ signals are utilized by the present invention to latch the data onto node 503 during the CLK phase and to maintain the data during the CLK_ phase of the signal.

Those skilled in the art will readily understand the operation of an inverter. However, for completeness the operation of inverters 508 and 510 relative to the input clock signal will now be described. It should be noted that the clock signal may have an operating frequency in the range of from 33 MHZ to in excess of 166 MHZ, or the like. When the clock signal is high, N type transistor 613 is turned on and will conduct electricity. N type devices create an electrically conductive path between their source and drain when a voltage (of a sufficient level to switch the device) is applied to their gate. In this case, transistor 612 conducts when the clock signal is high (logical 1) and node 511 is pulled to ground (logical 0). This low level is then input to inverter 510 and causes P type transistor to conduct electricity. P type devices create an electrically conductive path between their source and drain when ground (no voltage) is applied to their gate. Thus, transistor 618 conducts when the logical 0 is input from inverter 508 and pulls node 513 up to Vdd. Of course, when the clock signal is a low level (logical 0), then transistor 612 is turned on and pulls node 511 to Vdd and outputs a high level to inverter 510 such that transistor 619 conducts and pulls node 513 to ground.

Figure 6:
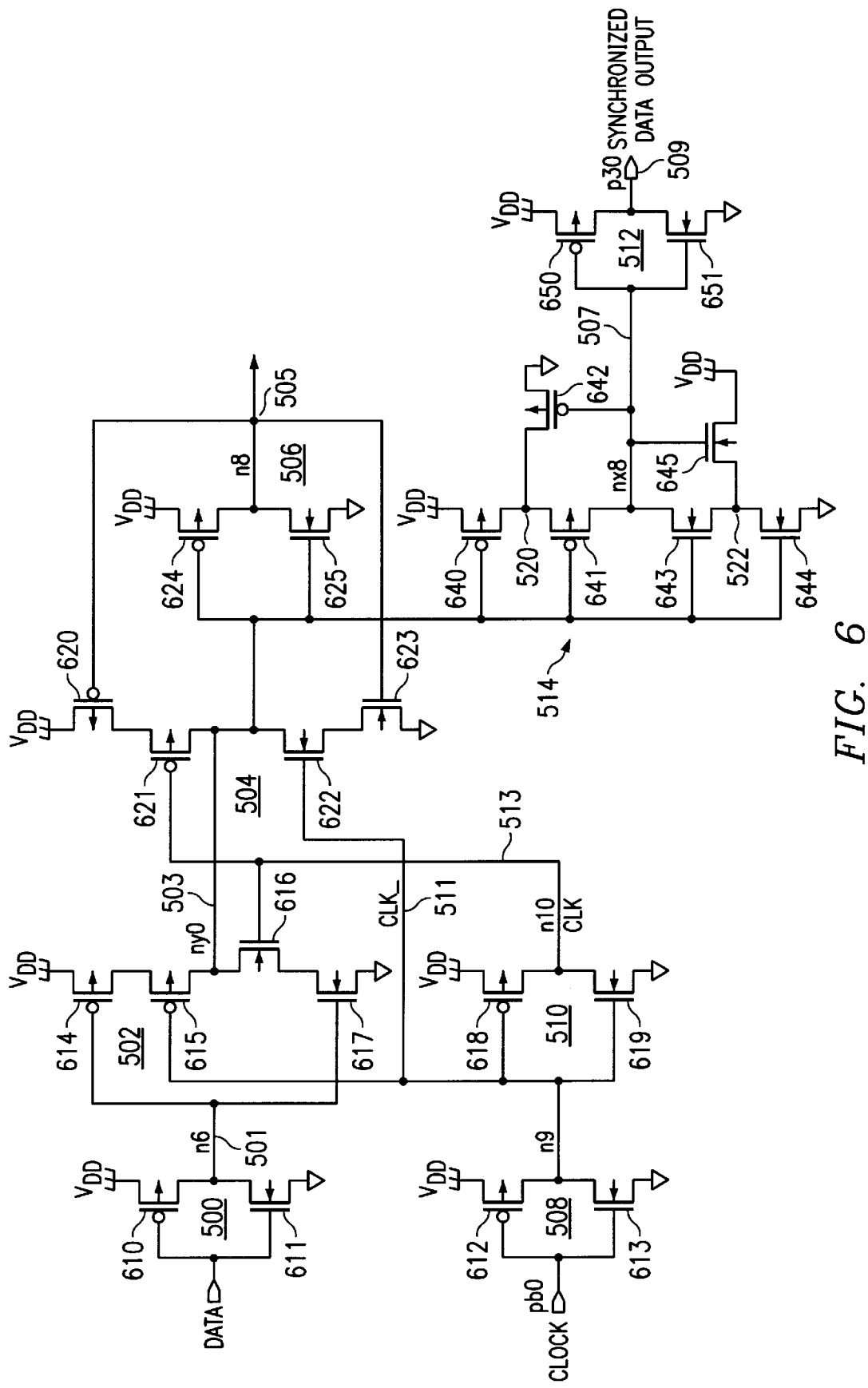
FIG. 6 is a schematic diagram of the preferred embodiment of the present invention including the transistors utilized to create the logic elements of FIG. 5.

It should be noted that part of the metastability protection of the present invention includes optimizing the design of the circuit of FIG. 6 to prevent a metastable event from occurring. In one embodiment the ratio of the transistor sizes used in circuits 508 and 510 are adjusted to optimizes the transition time of the clock signal. That is, some of the transistors can be sized stronger (less impedance) or weaker (greater impedance) relative to the other transistors to make a definite transition occur between a high clock input and low clock output, or vice versa. For example, depending on the application, the P transistors can be sized relatively stronger (less impedance) when compared to the N transistors in order to cause a well defined transition from a low to a high value.

The data signal from the asynchronous network is input to inverter 500. When this data signal is at a high level (1), N type transistor 611 conducts and pulls node 501 to ground (0), thereby causing a logical 0 to be input to gated inverter 502. However, when the asynchronous data signal is at a low level (0), then N type transistor 610 will conduct and pull node 501 to Vdd and input a logical 1 to gated inverter 502.

Next, it will be described how the present invention latches the data signal onto node 503. When the clock signal is at a high level, node 511 is pulled to ground through transistor 613. This logical 0 signal is also provided to P type transistor 615, causing it to be turned on. At the same time the logical 0 is provided to inverter 510, which causes a logical 1 to be present on node 513 (since transistor 618 is turned on and pulls node 513 to Vdd). This logical 1 is then provided to N type transistor 616, causing it to be turned on. At this time, when the system clock is at a high level (logical 1), gated inverter 502 is enabled. Therefore, the inverted asynchronous data on node 501 is input to inverter 502. If the data on node 501 is a logical 1, then N type transistor 617 is turned on and node 503 is pulled to ground, through transistors 616 and 617, and a logical 0 is present thereon (original asynchronous data). If, on the other hand, a logical 0 is present on node 501, then P type transistor 614 is turned on and node 503 is pulled up to Vdd through transistors 614 and 615. In this manner the data from the asynchronous system, input to inverter 500, is latched on to node 503 when the system clock signal is high.

When the system clock signal transitions to a low level (0), then a logical 1 is output from inverter 508 on node 511 and transistor 615 remains turned off. Similarly, the logical 0 output from inverter 510 causes transistor 616 to remain turned off. Thus, the data on node 501 cannot be transmitted to node 503. However, the data on node 503 will be maintained during the low level phase of the system clock signal.

During the low level (0) phase of the system clock, a logical 0 is input to inverter 508. A logical 1 is then output from inverter 508 onto node 511, which is connected to N type transistor 622. This transistor 622 is then turned on to conduct electricity. Node 511 is also connected to inverter 510, which then outputs a logical 0 onto node 513 (based on the logical 1 input from node 511). This logical 0 is then input to P type transistor 621, thus causing it to be turned on and conduct electricity. Therefore, during the low level phase of the system clock, both transistors 621 and 622 are turned on and conduct electricity.

From FIG. 6, it can be seen that node 503 is also connected to input of inverter 506, which includes N type transistor 625 (connected to ground) and P type transistor 624 (connected to Vdd). When node 503 is at a logical 1, then transistor 625 is turned on and will pull node 505 to ground. Node 505 is connected to the input of P type transistor 620 of gated inverter 504. Since, transistor 621 is also turned on during the low phase of the clock, then node 503 is pulled to Vdd (through transistors 620 and 621), thereby maintaining that logical 1 value thereon.

When node 503 is at a logical 0, then transistor 624 will pull node 505 up to Vdd. Node 505 is also connected to the input of N type transistor 623. As noted above, transistor 622 will already be turned on, due to the low level of the system clock, and node 503 will be pulled to ground (through transistors 622, 623), thereby maintaining the logical 0 value on node 503. Since, transistors 615 and 616 are turned off during the low level phase of the clock no new data can be placed on node 503. To summarize, when node 503 is a logical 1, transistor 620 is turned on, and when node 503 is at logical 0, transistor 623 is turned on. Since, transistors 621 and 622 are already turned on during the low level phase of the system clock (as previously described) the logical value previously latched on to node 503 is maintained.

The present invention can cause the likelihood of a metastable occurrence to be reduced by adjusting the relative size/ratio of the transistors in inverters 502 and 504. These transistors can be sized to create a high gain circuit, i.e. node 503, which causes a fast recovery from a metastable condition. This circuit will cause the tradeoffs between capacitive load and current to be optimized.

The aforementioned circuit of the present invention provides metastability protection by helping to prevent a metastable condition and then causing any metastable event to be quickly resolved (reduces the Miller effect and causes the gate to have a higher gain-bandwidth product). This circuit also has reduced capacitance and also affords some level of protection by increasing the synchronizing register's immunity against the occurrence of a metastable state. Thus, it should be noted that the present invention provides multiple protection techniques relative to metastability: (1) protection against the occurrence of a metastable state (reduced capacitance); (2) quick resolution of a metastable condition (reduction of Miller effect); and (3) ensuring a definite output logic level (0, 1) when a metastable event does occur. Therefore, the entire circuit of FIG. 6 is optimized for protection against a metastable condition.

Metastability is probabilistic and the mean time between failure (MTBF) of a synchronizer can be calculated. If a metastable condition does occur one preferred embodiment of the present invention focuses on ensuring that a definite valid output signal is received by the synchronized network, from the synchronizing register.

The present invention also includes an output circuit 514 that ensures a definite output level (1 or 0) upon the occurrence of a metastable state. As noted above, the asynchronous data input to the synchronizing latch of the present invention is latched onto node 503. This node is also connected to the input of output circuit 514 which includes a gated inverter.

In circuit 514, a first P type transistor 640 is connected between Vdd and a node 520. A second P type transistor 641 is connected to node 520 and to the output node 507. The gate of each of the P transistors 640 and 641 is connected to node 503. Further, N type transistor 644 is connected between ground and a node 522, while another N type transistor 643 is connected between node 522 and output node 507. Again, the gate of each N transistor 643 and 644 is connected to node 503.

Additionally, a P type feedback transistor 642 is provided and connected between ground (0) and node 520. The gate of transistor 642 is connected to the output node 507. An N type feedback transistor 645 is also provided and connected between Vdd (1) and node 522, with its gate being connected to the output node 507.

Another inverter 512 is also provided, because the output of circuit 514 is inverted relative to node 503 and inverter 512 is provided to change the data signal on node 507 back to the same level as was present on node 503. Inverter 512 includes P type transistor 650 which pulls the output node 509 to Vdd when a logical 0 is present on node 507. N type transistor 651 is also provided which pulls the output node 509 down to ground (0) when a logical 1 is present on node 507. Thus, the synchronized data output on node 509 will be the same as the data latched on to node 503 (in accordance with the system clock from the synchronized network) from the asynchronous data network.

The metastability protection characteristics of circuit 514 will now be more further described. During normal non-metastable conditions, when a definite logical 1 is present on node 503, transistors 643 and 644 turn on causing node 507 to be pulled to ground (logical 0). When a logical 0 is present on node 503, then transistors 640, 641 are turned on and pull node 507 up to Vdd (logical 1). However, during metastability the value on node 503 will oscillated between logical 0 and logical 1. This means that a voltage of somewhere between 0.0 and 2.5 volts, 3.3 volts, 5.0 volts, or the like (depending on the system voltage) will be present on node 503. This unstable voltage level is also input to the gates of transistors 640, 641, 643, 644. This unstable voltage will also be inverted and placed on node 507. For example, as the voltage on node 503, approaches ground (0), the voltage on node 507 approaches Vdd, since transistors 640 and 641 begin to breakdown and partially conduct electricity as the input to their gates approaches logical 0. It should be noted that there will be some voltage drop across transistors 640 and 641, since resistance is present between their source and drain. Similarly, transistors 643 and 644 will begin to partially conduct as the voltage on node 503 approaches Vdd. Correspondingly, the voltage on node 507 will begin to approach ground, as these transistors begin to conduct electricity and pull node 507 to ground. Again, there will be some voltage drop across transistors 643 and 644, since resistance is present between their source and drain.

When node 503 is at a logical 0, node 507 is at logical 1 and feedback transistor 642 is turned off. However, feedback transistor 645 is turned on and pulls node 522 to Vdd. Then, as the voltage level input to transistors 643 and 644 begins to oscillate and approach logical 1 they begin to turn on, causing transistor 644 to begin to conduct electricity and try and pull node 522 to ground. At the same time, the voltage on node 507 tends to approach logical 0 and cause transistor 645 to turn off. This push/pull relationship between feedback transistor 645 and transistor 644 will cause the value on node 507 to remain above/below the switching level of transistors 650, 651, respectively, of inverter 512, such that the synchronized data will not be output until a definite voltage value (logical 1 or logical 0) is present on node 507. It should be noted that transistor 644 will be sized to be relatively "stronger" than transistor 645, which is designed to be the "weaker" of the two transistors. A "stronger" transistor has a smaller impedance and will "win", i.e. be the final, steady-state conductive path, when connected in parallel with a "weaker"transistor, which has a higher electrical impedance level. Therefore, when the voltage oscillations finally settle out (metastability event ceases), and a logical 1 is present on node 503, then transistor 644 will begin to conduct and along with transistor 643, will pull node 507 to ground and turn off feedback transistor 645.

On the other hand, when node 503 is at a logical 1, node 507 is at logical 0 and feedback transistor 645 is turned off. However, feedback transistor 642 is turned on and pulls node 520 to ground. Then, as the voltage level input to transistors 640 and 641 begins to oscillate and approach logical 0 they begin to turn on, causing transistor 640 to begin to conduct electricity and try and pull node 520 to Vdd. Concurrently, the voltage on node 507 tends to approach logical 1 and cause transistor 642 to turn off. This "fighting" between feedback transistor 642 and transistor 640 will cause the value on node 507 to remain above/below the switching level of transistors 650, 651, respectively, of inverter 512, such that the synchronized data will not be output until a definite voltage value (logical 1 or logical 0) is present on node 507. In this case, transistor 640 will be sized to be relatively "stronger" in contrast to transistor 642, which will be the "weaker" of the two transistors. A "stronger" transistor has a smaller impedance and will "win", i.e. be the final, steady-state conductive path, when connected in parallel with a "weaker" transistor, which has a higher electrical impedance level. Therefore, when the voltage oscillations finally settle out (metastability event ceases), and a logical 0 is present on node 503, then transistor 640 will begin to conduct and, along with transistor 641, will pull node 507 up to Vdd and turn off feedback transistor 642.

The output circuit 514 functions in many ways as a Schmitt-trigger device. However, any other type of mechanism which ensures that the output of a synchronizing latch is a definite logical value could be used to implement the present invention. Such other mechanisms are contemplated by the scope of the present invention.

Although certain preferred embodiments have been shown and described, it should be understood that many changes and modifications may be made therein without departing from the scope of the appended claims.

I claim:

1. An apparatus, comprising:
   a first network for providing an asynchronous data signal to a second network that is synchronized with a system clock;
   means for synchronizing said asynchronous data signal with said system clock to convert said asynchronous data signal to a synchronized data signal;
   means for causing said synchronized data signal to be one of a first definite value or a second definite value independent of whether said asynchronous data signal and said system clock each transition substantially at the same point in time, wherein said means for causing comprises:
      an input node for receiving said synchronized data signal;
      an output node;
      means for switching said synchronized data signal to one of said first definite value or said second definite value, wherein said switching means comprises:
         at least two P type transistors connected in series and forming a first node therebetween;
         at least two N type transistors connected in series and forming a second node therebetween;
         wherein each of said at least two P type transistors and said at least two N type transistors have their gate connected to said input node; and
      feedback means for controlling said means for switching based upon a voltage level present on the output node; and
   means for outputting said synchronized data signal only when said synchronized data signal is at one of said first or said second definite value.

2. An apparatus according to claim 1 wherein said feedback means comprises:
   a first P type feedback transistor connected between ground and said first node, and having its gate connected to said output node; and
   a first N type feedback transistor connected between a power supply voltage and said second node, and having its gate connected to said output node.

3. An apparatus according to claim 2 wherein said first P type feedback transistor and one of said at least two P type transistors are sized such that one of said first definite value or said second definite value will be present on said output node only when said synchronized data signal is at one of said first definite value or said second definite value.

4. An apparatus according to claim 3 wherein said first N type feedback transistor and one of said at least two N type transistors are sized such that one of said first definite value or said second definite value will be present on said output node only when said synchronized data signal is at one of said first definite value or said second definite value.

5. A method for ensuring a definite value is output from a synchronizing latch, comprising the steps of:
   providing an asynchronous data signal from a first network to a second network that is synchronized with a system clock;
   synchronizing said asynchronous data signal with said system clock to convert said asynchronous data signal to a synchronized data signal;

causing said synchronized data signal to be one of a first definite value or a second definite value independent of whether said asynchronous data signal and said system clock each transition substantially at the same point in time, wherein said step of causing further comprises the steps of:

receiving said synchronized data signal on an input node;

switching said synchronized data signal to one of said first definite value or said second definite value, wherein said step of switching comprises:

connecting at least two P type transistors in series and forming a first node therebetween; and connecting at least two N type transistors in series and forming a second node therebetween;

wherein each of said at least two P type transistors and said at least two N type transistors have their gate connected to said input node;

controlling, by feedback means, said switching based upon a voltage level present on the output node; and providing, on said output node, said synchronized data signal; and outputting said synchronized data signal only when said synchronized data signal is at one of said first or second definite value.

6. A method according to claim 5 wherein said step of controlling comprises the steps of:

connecting a first P type feedback transistor between ground and said first node, and connecting its gate to said output node; and connecting a first N type feedback transistor between a power supply voltage and said second node, and connecting its gate connected to said output node.

7. A method according to claim 6 wherein said first P type feedback transistor and one of said at least two P type transistors are sized such that one of said first definite value or said second definite value will be present on said output node only when said synchronized data signal is at one of said first definite value or said second definite value.

8. A method according to claim 7 wherein said first N type feedback transistor and one of said at least two N type transistors are sized such that one of said first definite value or said second definite value will be present on said output node only when said synchronized data signal is at one of said first definite value or said second definite value.

9. A data processing system, comprising:

a plurality of input/output devices for providing an asynchronous data signal;

a central processing unit, synchronized with a system clock, for receiving said asynchronous data signal;

a latch for synchronizing said asynchronous data signal with said system clock to convert said asynchronous data signal to a synchronized data signal;

circuit means for causing said synchronized data signal to be one of a first definite binary value or a second definite binary value independent of whether said asynchronous data signal and said system clock each transition substantially at the same point in time, wherein said circuit means comprises a switching circuit that causes said synchronized data signal to one of said first definite binary value or said second definite binary value, said switching circuit including at least two P type transistors connected in series and forming a first node therebetween, and at least two N type transistors connected in series and forming a second node therebetween, wherein each of said at least two P type transistors and said at least two N type transistors have their gates connected to said input node; and means for outputting said synchronized data signal only when said synchronized data signal is at one of said first definite binary value or said second definite binary value.

10. An apparatus according to claim 9 wherein said circuit means further comprises a feedback circuit for controlling said switching circuit in accordance with a voltage level present on an said output node.

11. An apparatus according to claim 10 wherein said feedback circuit comprises:

a first P type feedback transistor connected between ground and said first node, and having its gate connected to said output node of said circuit means; and a first N type feedback transistor connected between a power supply voltage and said second node, and having its gate connected to said output node of said circuit means;

wherein said first P type feedback transistor and one of said at least two P type transistors are sized such that one of said first definite value or said second definite value will be present on said output node only when said synchronized data signal is at one of said first definite value or said second definite value; and wherein said first N type feedback transistor and one of said at least two N type transistors are sized such that one of said first definite value or said second definite value will be present on said output node only when said synchronized data signal is at one of said first definite value or said second definite value.

* * * * *